United States Patent
Lerner

(10) Patent No.: US 10,490,401 B1
(45) Date of Patent: Nov. 26, 2019

(54) SCALABLE GRAPHENE NANORIBBON ARRAYS FOR DIGITAL TRANSISTORS

(71) Applicant: Mitchell B. Lerner, San Diego, CA (US)

(72) Inventor: Mitchell B. Lerner, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 4 days.

(21) Appl. No.: 15/258,120

(22) Filed: Sep. 7, 2016

Related U.S. Application Data

(60) Provisional application No. 62/216,822, filed on Sep. 10, 2015.

(51) Int. Cl.
*H01L 21/44* (2006.01)
*H01L 21/02* (2006.01)
(Continued)

(52) U.S. Cl.
CPC ........ *H01L 21/02645* (2013.01); *C23C 16/04* (2013.01); *C23C 16/26* (2013.01); *C23C 16/56* (2013.01); *H01L 21/02527* (2013.01); *H01L 21/042* (2013.01); *H01L 21/0425* (2013.01); *H01L 21/44* (2013.01); *H01L 29/0665* (2013.01); *H01L 29/1606* (2013.01); *H01L 29/78684* (2013.01); *H01L 29/78696* (2013.01)

(58) Field of Classification Search
CPC ....................................... H01L 21/44
See application file for complete search history.

(56) References Cited

U.S. PATENT DOCUMENTS

2011/0092054 A1\* 4/2011 Seo ................ H01L 21/268 438/473
2011/0291068 A1\* 12/2011 Kobayashi ........ H01L 29/66742 257/9

(Continued)

OTHER PUBLICATIONS

Yu et al., "Control and Characterization of Individual Grains and Grain Boundaries in Graphene Grown by Chemical Vapor Deposition," Nature Materials (Jun. 2011).

(Continued)

*Primary Examiner* — Thao X Le
*Assistant Examiner* — Geoffrey H Ida
(74) *Attorney, Agent, or Firm* — Naval Information Warfare Center, Pacific; Kyle Eppele; Arthur K. Samora

(57) ABSTRACT

Methods for fabricating a graphene nanoribbon array in accordance with several embodiments of the present invention can include the steps of depositing PMMA dots on a substrate in an m×n grid, to selectively seed graphene flakes on the substrate by controlling the growth of the graphene flakes on the substrate during the graphene deposition. The methods can further include the steps of masking the graphene flake edges with an insulator layer, at a very low deposition time or at a lower precursor concentration, to ensure there are not enough insulator molecules to form a complete layer over the flakes, but only enough insulator to form around the flakes edges. Once the graphene flake edges are masked, the bulk graphene can be etched, and the masking insulator can be removed to expose the resulting graphene nanoribbon.

14 Claims, 6 Drawing Sheets

(51) Int. Cl.
*C23C 16/04* (2006.01)
*C23C 16/26* (2006.01)
*C23C 16/56* (2006.01)
*H01L 21/04* (2006.01)
*H01L 29/16* (2006.01)
*H01L 29/06* (2006.01)
*H01L 29/786* (2006.01)

(56) References Cited

U.S. PATENT DOCUMENTS

2012/0088039 A1* 4/2012 Yu ................... C01B 31/0453
427/596
2016/0240692 A1* 8/2016 Shepard .................. H01L 29/45

OTHER PUBLICATIONS

Pumera, M., "Graphene-based nanomaterials and their electrochemistry," Chemical Society Reviews, Chem. Soc. Rev., 39, pp. 4146-4157 (2010).
Xie et al., "Graphene Edge Lithography," Nanoletters (2012), American Chemical Society, Nano Lett. 2012, 12, 4642-4646 (2012).

* cited by examiner

SCALABLE GRAPHENE NANORIBBON ARRAYS FOR DIGITAL TRANSISTORS

CROSS REFERENCE TO RELATED APPLICATIONS

This application claims the benefit of U.S. Provisional Application 62/216,822, filed Sep. 10, 2015, by Mitchell Lerner, entitled "Scalable Graphene Nanoribbon Arrays for Digital Transistors". The contents of the '822 application are hereby incorporated by reference into this specification.

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103119.

FIELD OF THE INVENTION

The present invention pertains generally to methods for manufacturing a graphene nanoribbon array. More particularly, the invention pertains to methods for reproducibly fabricating large arrays of transistors from graphene nanoribbons with consistently high ON/OFF ratios, or band gaps.

BACKGROUND OF THE INVENTION

A need exists for a method for fabricating large arrays of transistors from graphene nanoribbons. With Moore's Law scaling of silicon reaching its limits, new technologies are required to continue making faster, more cost efficient processors. The current semiconductor roadmap has known solutions for achieving milestones six years into the future with looming questions beyond.

One potential silicon replacement is graphene due to its inherently high carrier mobility. However, the lack of a natural band gap in graphene has hindered its development for digital electronics applications. Without a proper band gap, the material is always conductive, even in the OFF state. This can represent an enormous power sink, not practical for commercial electronics. Chemical treatments have been demonstrated to open a small bandgap, but these typically destroy the conduction properties of graphene as well. It has been theorized that graphene nanoribbons (GNRs) having a width of less than ten nanometers would have a band gap of tens of eV due to quantum confinement effects, and there are some experiments which corroborate this picture. However, scalability and reproducibility of GNR fabrication remains an unsolved problem.

While there have been experiments demonstrating that GNR samples can achieve ON/OFF ratios>1000, these samples are very hard to produce, often taking months to make one functional device. Such efforts have used GNRs that were deposited randomly on a substrate from solution, or created in a top down process using electro-migration. More conventional lithographic processing of graphene tends to leave residues behind, which can contaminate the sample, and which can reduce its effectiveness as a transistor. To make a practical commercial technology, scale up must be demonstrated using other means of device fabrication. For graphene to supplant silicon in next generation processors, there must be a way to fabricate large numbers of graphene transistors with high ON/OFF ratios, i.e. having a band gap, reproducibly.

In view of the above, it is an object of the present invention to provide GNR's and methods for fabricating GNR's that can allows for large numbers of graphene nanotransistors with band gaps. Another object of the present invention is to provide GNR's and methods for fabricating GNR's that can result in GNR's with band gaps, but that can also retain their conductivity. Yet another object of the present invention can be to provide GNR's and methods for fabricating GNR's that can fabricate an orderly array of GNR's using a bottom up, vice a top down process. Still another object of the present invention can be to provide methods for GNR's and methods for fabricating GNR's that can be consistent and reproducible. Still another object of the present invention can be to provide GNR's and methods for fabricating GNR's that can be scalable and that can be practiced in a cost-efficient manner.

SUMMARY OF THE INVENTION

Methods for fabricating a graphene nanoribbon array (GNR) in accordance with several embodiments of the present invention can include the steps of selectively seeding graphene flakes on a substrate by controlling the growth of the graphene flakes on the substrate. This can be accomplished by depositing polymethyl methacrylate (PMMA) dots on the substrate in an m×n grid before deposition of the graphene on the PMMA dots and the substrate. The PMMA dots cause growth of graphene flakes which are hexagonal when viewed in top plan, and which can be grown in an orderly symmetrical array that can be scalable.

The methods according to several embodiments can further include the step of masking the graphene flake edges with a layer of insulator. The insulator can be $Al_2O_3$ or $HfO_2$, or a similar material with similar properties. The masking step can be accomplished with a very low deposition time, or at a lower precursor concentration, which can ensure there are not enough molecules to form a complete layer over the graphene flakes, but only enough to form around the graphene flake edges. Once the graphene flake edges are masked, the bulk graphene can be etched, and the masking insulator can be removed to expose the resulting GNR.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which.

DETAILED DESCRIPTION OF THE WRITTEN EMBODIMENTS

Figure 1:
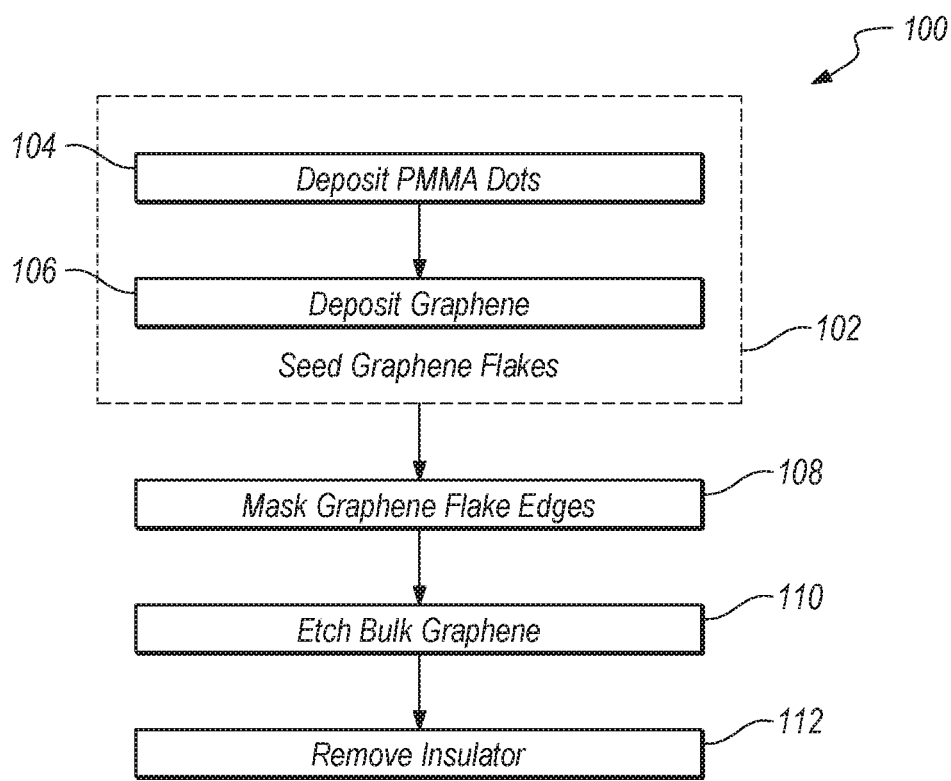
FIG. 1 is a block diagram of steps that can be taken to practice some of the methods of the present invention according to several embodiments.
Figure 2:
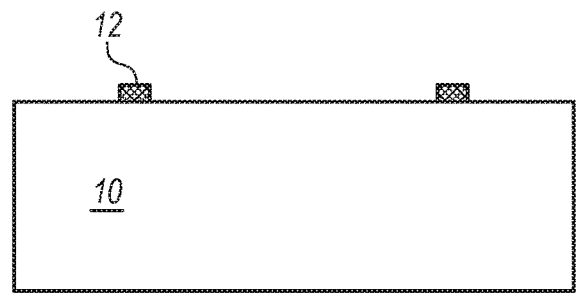
FIG. 2 is a cross-sectional view of the substrate once polymethyl methacrylate (PMMA) dots have been placed on a substrate using the methods of FIG. 1.
Figure 3:
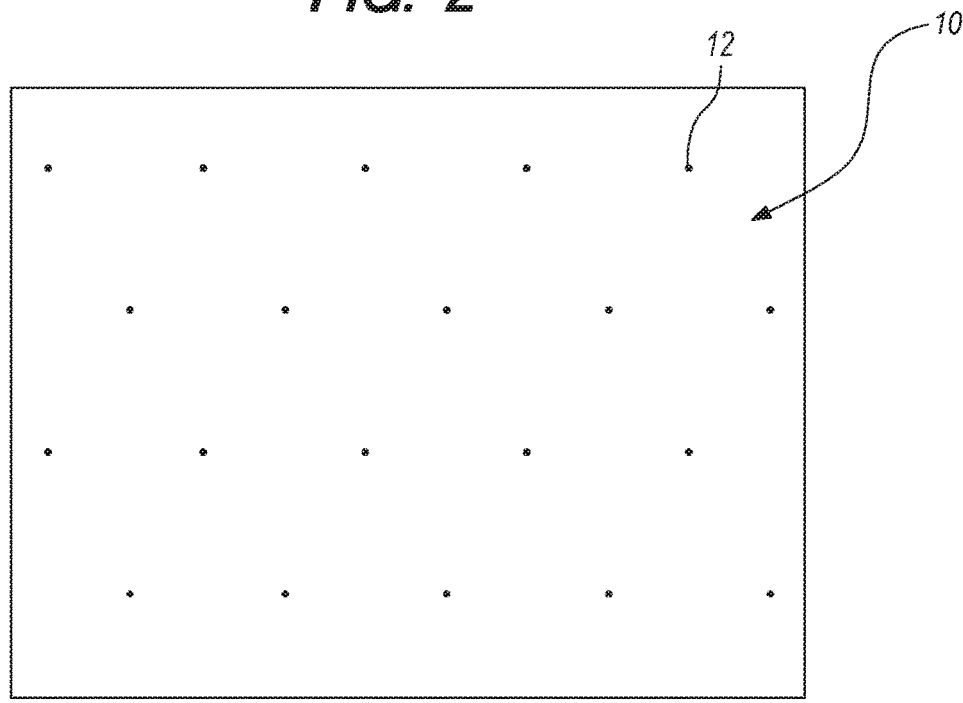
FIG. 3 is a top plan photograph of the substrate after the initial step of seeding graphene flakes shown in FIG. 2 has begun.

Referring initially to FIGS. 1-3, a method for fabricating a graphene nanoribbon (GNR) can be shown and can be designated using reference character 100. As shown, method 100 can include the initial step 102 of seeding the growth of graphene flakes on a substrate. To do this, and as shown in FIGS. 1-2, the first part of step 102 in seeding the graphene flakes to create a high yield process can be to control placement location of the GNR on a substrate 10 (see FIG. 2). To this effect, one must control the seeding of initial graphene growth, by placing polymethyl methacrylate (PMMA) dots 12 on substrate 10. Different polymers could also be used. Alternatively, defects in the growth foil substrate 10 can be induced at the locations with graphene growth is desired.

Figure 4:
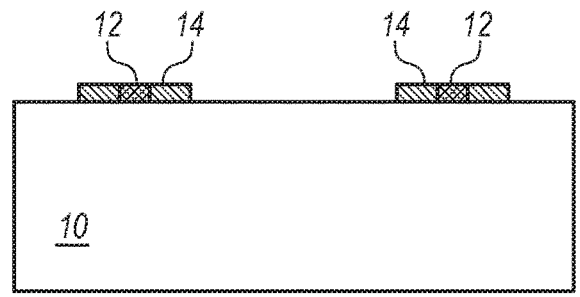
FIG. 4 is a cross-sectional view of the substrate of FIG. 2 once graphene has been deposited onto the substrate and flakes have begun to form.

The placement of PMMA dots (step 104 in method 100), can be done with PMMA lithographic deposition at known locations in an m×n grid on a copper growth catalyst foil substrate 10, as perhaps best seen in FIG. 3. Once the PMMA dots are in place, the methods according to several embodiments can include the step of deposition of graphene onto the substrate, as shown by step 106 in FIG. 1. When the foil substrate 10 is placed in a furnace under $Ar/H_2/CH_4$ at 1050° C. (around 1000° C. to 1100° C.), growth of graphene flakes 14 can be nucleated on the substrate 10 at the locations of the PMMA sites 12, as shown in FIG. 4. The deposition step 106 can be accomplished by chemical vapor deposition (CVD) growth, epitaxial growth, RF inductive growth, or any other catalytic process for deposition of graphene known in the art.

Figure 5:
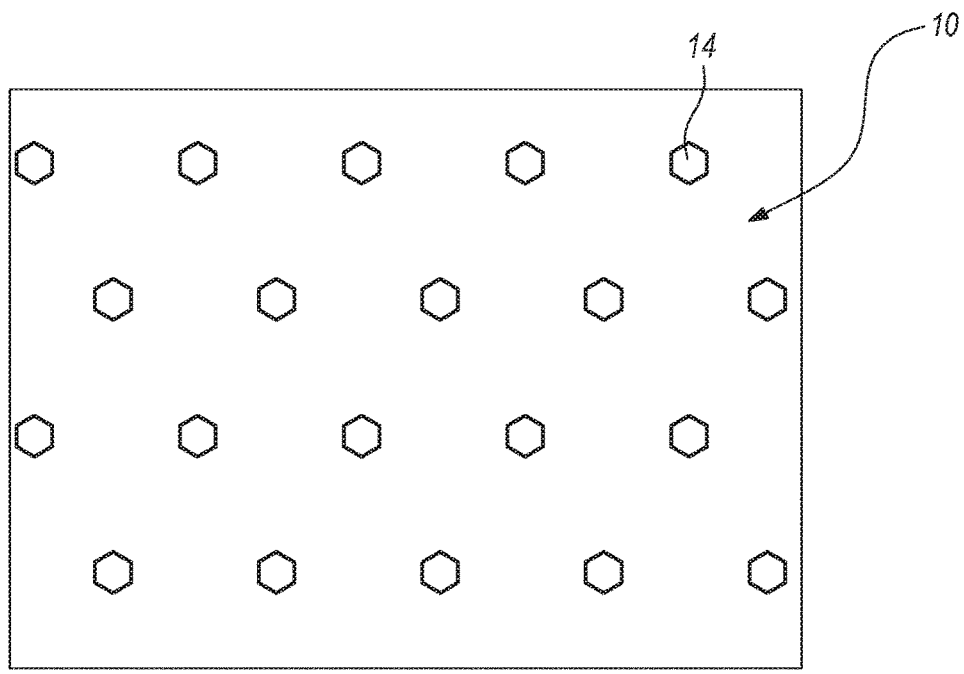
FIG. 5 is a top plan photograph of the flakes shown in FIG. 4, after graphene has been deposited and flakes have been given time to form.
Figure 6:
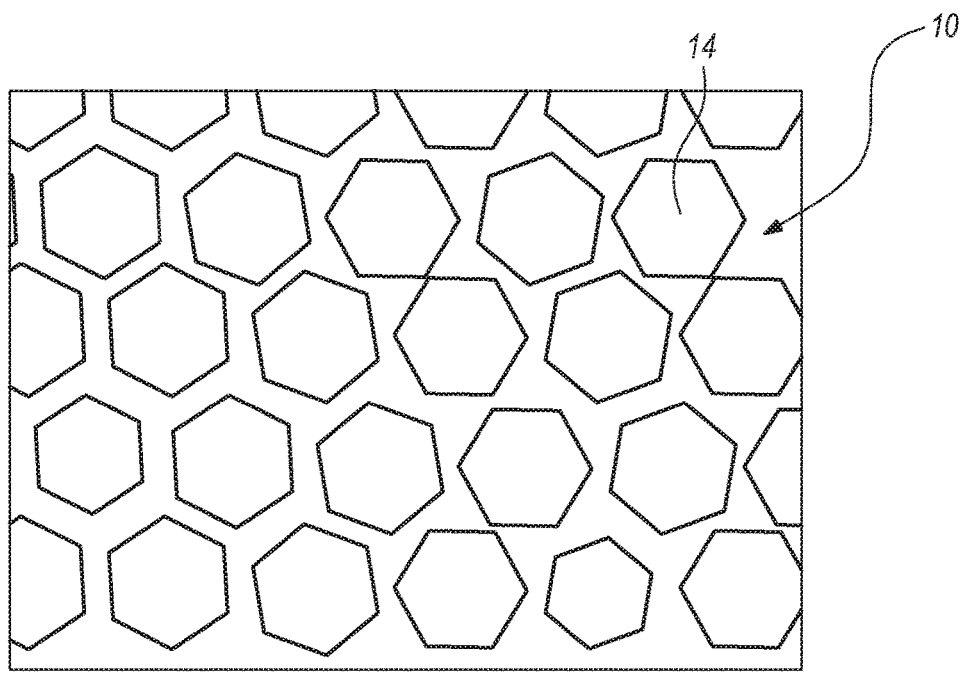
FIG. 6 is the same photograph as FIG. 5, but with the graphene flakes being given more time to grow.
Figure 7:
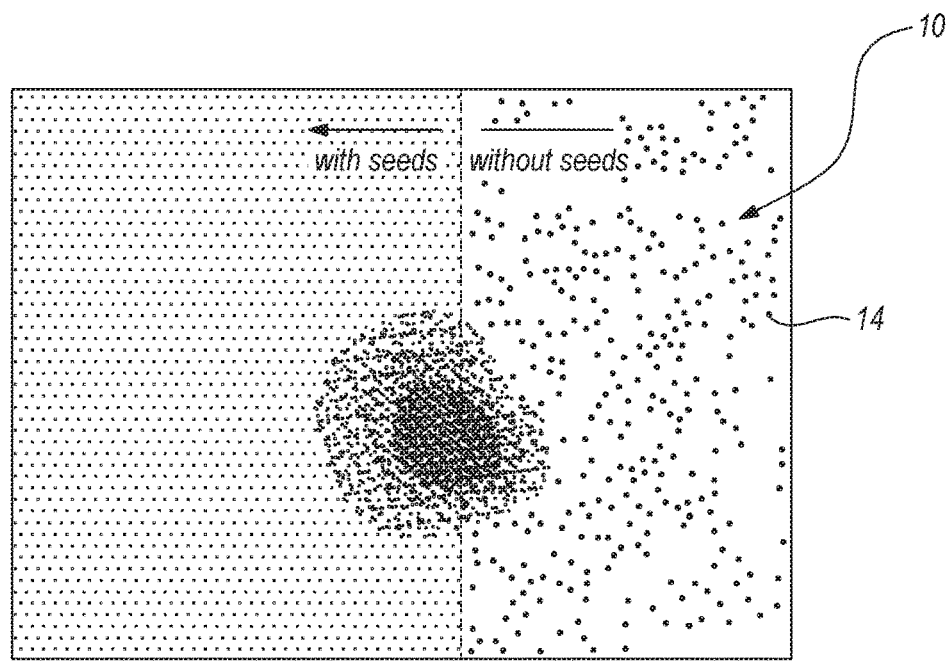
FIG. 7 is a much smaller scale photograph of FIG. 6, which illustrates the random, disorderly graphene deposition process that can occur, when compared to the methods of FIG. 1 that include the seeding step to control the graphene deposition.

The graphene flakes 14 can also be seen in FIGS. 5 and 6. As shown in FIGS. 5 and 6, the size of the graphene flakes 14 can be controlled by the growth time, while the periodicity of the m×n array can be controlled by the initial spacing of the PMMA dots. These graphene crystals 14 can serve as the template for GNR harvesting, as described in more detail below. FIG. 7 illustrates how the graphene flake process can occur if no seeding step is taken. As shown in portions of FIG. 7, the graphene growth can be asymmetrical and uneven, which can a disadvantage if scalable, reproducible methods are desired. When the methods of the present invention are used, graphene flakes can be grown in the dense symmetrical scalable pattern, as also shown in small scale in FIG. 7.

Figure 8:
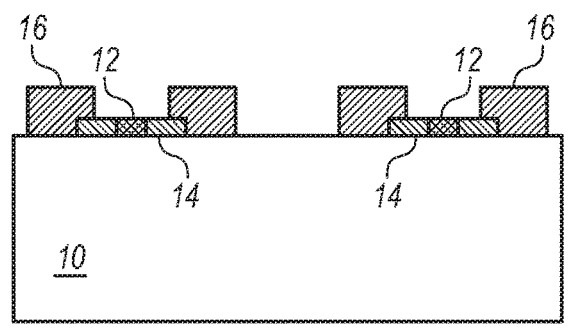
FIG. 8 is a cross-sectional view of the substrate of FIG. 4, after an insulator has been deposited on the flake edges.

With graphene crystal flakes 14 at known grid locations, one must selectively etch away most of the crystal flake 14 and leave only a narrow ribbon. Since conventional lithography tends to contaminate the samples, alternative methods of masking the crystal edges must be employed. To do this, the methods according to several embodiments can include the step 108 of masking the graphene flake edges with an insulator 16, as shown in FIGS. 1 and 8. To accomplish step 108, one can use atomic layer deposition of an insulator ($Al_2O_3$ or $HfO_2$ for example) at very low deposition times or low precursor concentrations. Under these conditions, there are not enough insulator molecules to form a complete atomic layer. Instead, molecules accumulate only at the graphene edges (FIG. 8). Other insulators could be used, provided the corresponding deposition time and/or precursor concentrations are sufficiently brief, or low in the case of precursor concentrations, to only allow enough insulator to deposit around the edges of the flakes.

Figure 9:
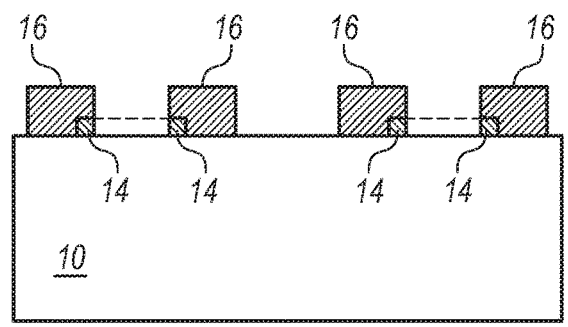
FIG. 9 is a cross-sectional view of the substrate of FIG. 8 after the bulk graphene has been etched away.

With the insulator layer 16 now covering the edges of the graphene flakes 14, the methods according to several embodiments can include the step of etching away the bulk graphene, as shown by step 110 in FIG. 1. The etching step 108 can be accomplished with a gentle oxygen plasma etch (30 W for 30 sec). As shown in FIG. 9, once the bulk of the graphene flake 14 has been etched, all that remains in the portion of the flake 14 (the edge) that was covered by insulator 16 (the back edge of flake 14 is shown in phantom in FIG. 9).

Figure 10:
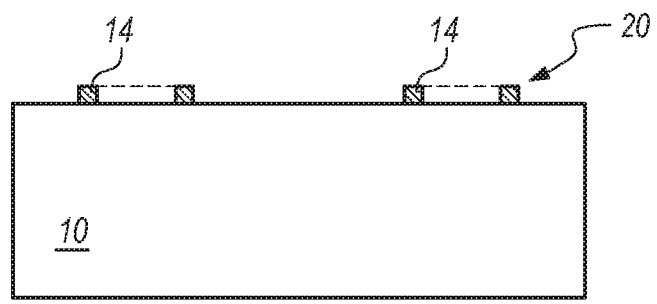
FIG. 10 a cross-sectional view of the substrate of FIG. 9 after the insulator has been etched away to expose the resulting graphene nanoribbon.

As shown in FIG. 1, the next step in method 100 can be the subsequent removal of the protective oxide layer, as shown by step 112. Step 112 can be accomplished with a gentle KOH wash. The result can be a GNR 20, which can be the shape of a hexagon when viewed in top plan (other geometries are possible, depending on the geometry of the PMMA dots 12 used in depositing step 104, as part of seeding step 102 and other factors. The GNR 20 is shown in cross-section in FIG. 10.

Figure 11:
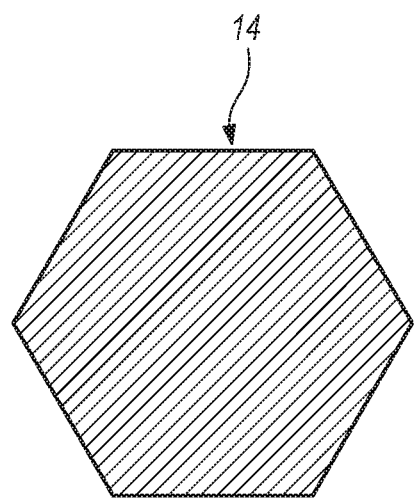
FIG. 11 is a top plan representation of a single hexagonal graphene flake.
Figure 12:
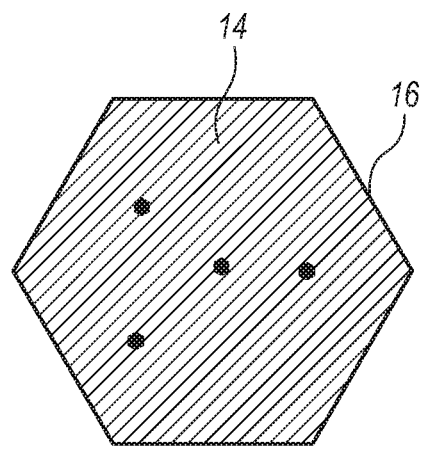
FIG. 12 is a top plan representation of the flake of FIG. 11 once the insulator has been deposited.
Figure 13:
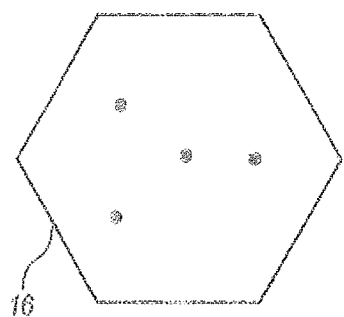
FIG. 13 is a top plan representation of the flake of FIG. 12 once the bulk graphene has been etched.
Figure 14:
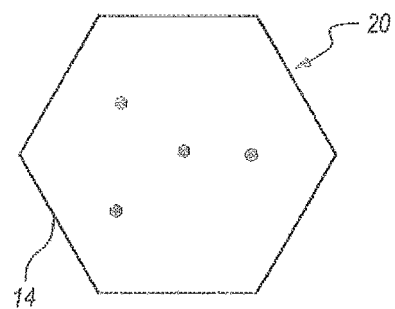
FIG. 14 is a top plan representation of the flake of FIG. 13 once the insulator has been removed; and, FIG. 15 is a top plan representation of the nanoribbon of FIG. 14, which has been converted to a nanotransistor.

FIGS. 11-14 are top plan representations of a single graphene flake, which can be used to better understand the methods according to several embodiments. FIG. 11 is a single graphene flake 14 after step 102 has been taken. FIG. 12 illustrates the presence of insulator 16 after step 108 has been taken. FIG. 13 illustrates the insulator, which is in the shape of a hexagonal ribbon, and which is all that can be seen in top plan after the bulk graphene has been etched away, step 110, while FIG. 14 shows the desired GNR 20 after insulator has been removed, as shown in step 112 of FIG. 1.

Figure 15:
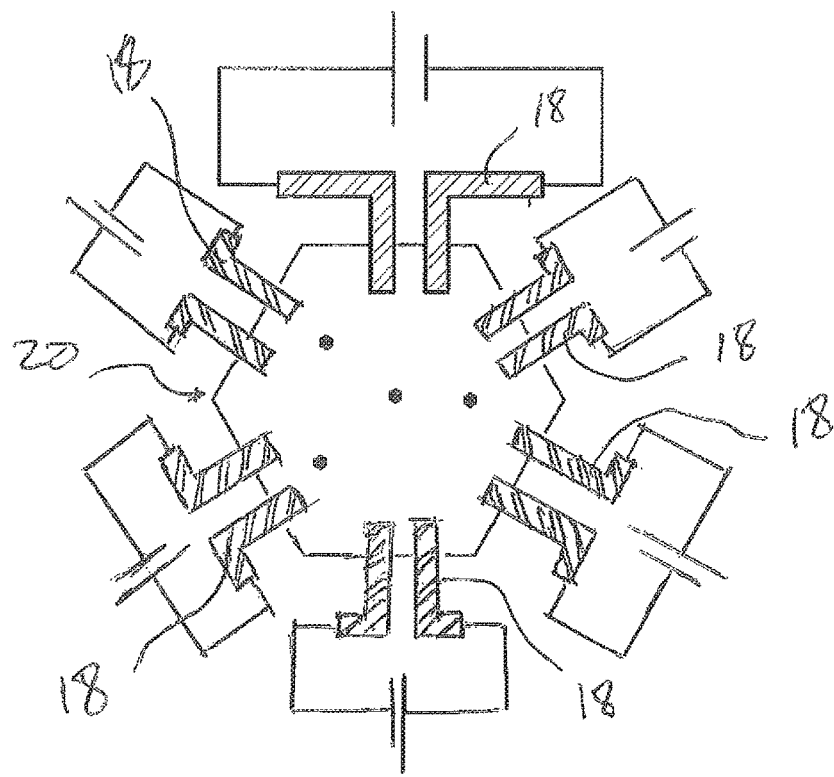

Referring now to FIG. 15, electrode deposition can be accomplished to measure the conduction of the GNR. Three terminal transistors can be fabricated by etching electrodes 18 in each facet of the GNR 20 using electron beam lithography or photolithography, with a silicon back plane serving as a global back gate. In this manner, each graphene hexagon will form at least one GNR transistor. In fact, several transistors could be made from a single hexagon using the different facets of the GNR 20 since electronic conduction around a vertex would be minimal outside the ballistic regime. More generally, the number of nanotransistors that can be formed can be based on the number of facets, which can be further based on the geometric profile of the flake, e.g., six nanotransistors can be made from a hexagonal GNR, either nanotransistors for an octagonal GNR, and so on. The width of the final graphene channel corresponds to the lateral dimension of the oxide nanoparticles, typically 2-3 nanometers. In this manner, one can fabricate an arbitrarily large array of GNR transistors with expected ON/OFF ratios >1000.

This method is an improvement over current silicon CMOS processing because it can scale down to smaller dimensions. With smaller digital transistors we can increase the packing density in next generation processors, malting them faster and less expensive. Though experiments have demonstrated this concept with graphene previously, there is as of yet no method for making millions of transistors reproducibly as required for industrial scale up. This method provides a pathway for large scale manufacturing of graphene transistors with an intrinsic band gap for digital computing.

The use of the terms "a" and "an" and "the" and similar references in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for fabricating a graphene nanoribbon array, comprising the steps of:
    A) selectively seeding the growth of graphene flakes on a substrate, including;
        A1) depositing PMMA dots on said substrate in an m×n grid, wherein a periodicity of the grid is controlled by an initial spacing of said PMMA dots on said substrate;
        A2) depositing said graphene on said PMMA dots and said substrate, wherein a size of said graphene flakes is controlled by controlling a growth time of said graphene flakes on said PMMA dots;
    B) masking said graphene flake edges with a layer of insulator;
    C) etching said graphene flakes;
    D) removing said insulator to expose an m×n array of said graphene nanoribbons, said nanoribbons having a plurality of facets when viewed in top plan;
    E) etching at least one electrode in each of said facets; and,
    F) providing a back plane to establish a graphene nanotransistor in each said facet of each said graphene nanoribbon.

2. The method of claim 1, wherein said step A2) is accomplished using a gas selected from the group consisting of Ar, $H_2$ or $CH_4$ at about 1050° C.

3. The method of claim 1, wherein said step A2) is accomplished using a process selected from the group consisting of CVD growth, epitaxial growth or RF inductive growth.

4. The method of claim 1, wherein said insulator is selected from the group consisting of $Al_2O_3$ or $HfO_2$.

5. The method of claim 1, wherein said substrate is a copper catalyst foil.

6. The method of claim 1, where said step C) is accomplished using an oxygen plasma etch at 30 W for 30 seconds.

7. The method of claim 1, wherein said step D) is accomplished using KOH.

8. A method for manufacturing a graphene nanotransistor grid, said method comprising the steps of:
    A) seeding the growth of graphene flakes on a substrate in an m×n array, including;
        A1) depositing PMMA dots on said substrate in an m×n grid, wherein a periodicity of said grid is controlled by an initial spacing of said PMMA dots on said substrate;
        A2) depositing said graphene on said PMMA dots and said substrate, wherein a size of said graphene flakes is controlled by controlling a growth time of said graphene flakes on said PMMA dots;
    B) masking said graphene flake edges with a layer of insulator;
    C) etching said graphene flakes;
    D) removing said insulator to expose an m×n array of said graphene nanoribbons, said nanoribbons having a plurality of facets when viewed in top plan;
    E) etching at least one electrode in each of said facets; and,
    F) providing a back plane to establish a graphene nanotransistor in each said facet of each said graphene nanoribbon.

9. The method of claim 8, wherein said step A2) is accomplished using a gas selected from the group consisting of Ar, $H_2$ or $CH_4$ at about 1050° C.

10. The method of claim 8, wherein said step A2) is accomplished using a process selected from the group consisting of CVD growth, epitaxial growth or RF inductive growth.

11. The method of claim 8, wherein said insulator is selected from the group consisting of $Al_2O_3$ or $HfO_2$.

12. The method of claim 8, wherein said substrate is a copper catalyst foil.

13. The method of claim 8, where said step C) is accomplished using an oxygen plasma etch at 30 W for 30 seconds.

14. The method of claim 8, wherein said step D) is accomplished using KOH.

* * * * *